(12) United States Patent
Matsuki et al.

(10) Patent No.: US 10,018,915 B2
(45) Date of Patent: Jul. 10, 2018

(54) PATTERN FORMING METHOD

(71) Applicant: Toshiba Memory Corporation, Tokyo (JP)

(72) Inventors: Kazuto Matsuki, Ota Tokyo (JP); Ryoichi Suzuki, Yokohama Kanagawa (JP); Shinichi Ito, Yokohama Kanagawa (JP); Seiji Morita, Shinagawa Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/208,316

(22) Filed: Jul. 12, 2016

(65) Prior Publication Data

US 2017/0178896 A1    Jun. 22, 2017

(30) Foreign Application Priority Data

Dec. 18, 2015    (JP) .................................. 2015-246936

(51) Int. Cl.
| | |
|---|---|
| *G03F 7/004* | (2006.01) |
| *G03F 7/40* | (2006.01) |
| *G03F 7/16* | (2006.01) |
| *H01L 21/3105* | (2006.01) |
| *B82Y 40/00* | (2011.01) |
| *B81C 1/00* | (2006.01) |
| *H01L 21/308* | (2006.01) |
| *B82Y 10/00* | (2011.01) |
| *G03F 7/00* | (2006.01) |
| *H01L 21/027* | (2006.01) |
| *H01L 21/311* | (2006.01) |

(52) U.S. Cl.
CPC .......... *G03F 7/168* (2013.01); *B81C 1/00031* (2013.01); *B82Y 10/00* (2013.01); *B82Y 40/00* (2013.01); *G03F 7/002* (2013.01); *G03F 7/40* (2013.01); *H01L 21/0271* (2013.01); *H01L 21/3086* (2013.01); *H01L 21/31058* (2013.01); *H01L 21/31144* (2013.01); *B81C 2201/0149* (2013.01)

(58) Field of Classification Search
CPC . G03F 7/002; H01L 21/0337; H01L 21/3086; B81C 1/00031; B81C 2201/0149; B82Y 10/00; B82Y 40/00
USPC ............ 430/5, 322, 325, 330, 331; 428/172; 438/689; 257/E21.038
See application file for complete search history.

(56) References Cited

U.S. PATENT DOCUMENTS 8,481,246 B2    7/2013 Asakawa et al.
8,956,808 B2    2/2015 Schmid et al.
(Continued)

FOREIGN PATENT DOCUMENTS

JP    5112562 B2    1/2013

*Primary Examiner* — Amanda C Walke
(74) *Attorney, Agent, or Firm* — Patterson & Sheridan, LLP

(57) ABSTRACT

A pattern forming method includes forming a guide pattern on a substrate including first and second regions and applying a directed self-assembly material including a first and a second polymer portion to the substrate. The first region is irradiated with an energy beam. The substrate is subjected to a heating process after irradiation and the directed self-assembly material in the second region separates into a first polymer phase and a second polymer phase. The directed self-assembly material is removed from the first region after irradiation.

20 Claims, 7 Drawing Sheets

(56) References Cited

U.S. PATENT DOCUMENTS

| | | | |
|---|---|---|---|
| 2009/0233236 A1* | 9/2009 | Black | B82Y 10/00 430/311 |
| 2012/0127454 A1 | 5/2012 | Nakamura et al. | |
| 2012/0238109 A1 | 9/2012 | Hattori et al. | |
| 2014/0030833 A1* | 1/2014 | Sato | H01L 51/0096 438/34 |
| 2014/0370442 A1* | 12/2014 | Ober | C08F 214/18 430/296 |
| 2015/0380239 A1* | 12/2015 | Cooper | G03F 7/004 257/499 |
| 2015/0380260 A1* | 12/2015 | Millward | B81C 1/00031 438/675 |

* cited by examiner

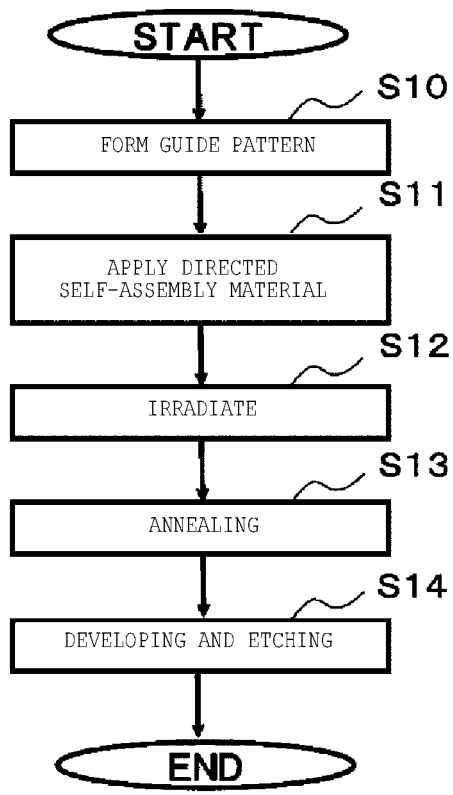
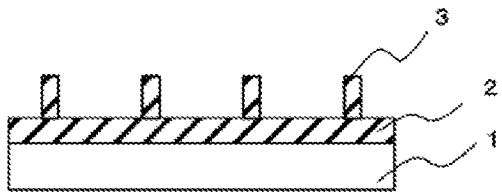
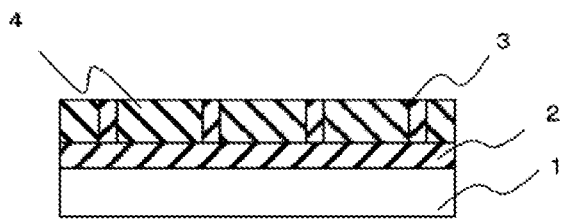

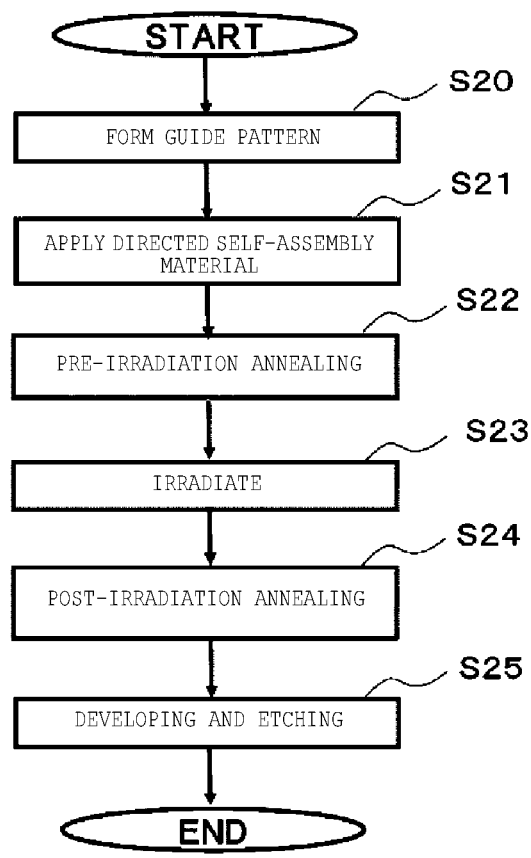

PATTERN FORMING METHOD

CROSS-REFERENCE TO RELATED APPLICATION

This application is based upon and claims the benefit of priority from Japanese Patent Application No. 2015-246936, filed Dec. 18, 2015, the entire contents of which are incorporated herein by reference.

FIELD

Embodiments described herein relate generally to a pattern forming method, in particular, a pattern forming method using a self-assembly material.

BACKGROUND

A lithography technique for forming a pattern exposes a photoresist film through a photo-mask and then develops the photoresist to provide the pattern which can be used as a circuit pattern and/or for forming electrical components such as a semiconductor device or a liquid crystal display device. In recent years, as the need for finer patterning techniques has increased a pattering technique employing directed self-assembly (DSA) has attracted considerable attention as method for providing a finer pattern than might otherwise be available through existing lithography techniques.

DESCRIPTION OF THE DRAWINGS

FIG. 1 is a flowchart illustrating aspects of a pattern forming method according to a first embodiment.

FIGS. 2A and 2B are cross-sectional diagrams illustrating a first process in the pattern forming method according to the first embodiment

FIG. 5 is a flowchart illustrating aspects of a pattern forming method according to a second embodiment.

DETAILED DESCRIPTION

Figure 3A:
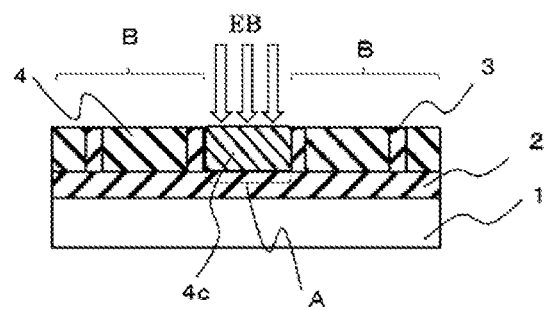
FIGS. 3A and 3B are cross-sectional diagrams illustrating a second process in the pattern forming method according to the first embodiment.

In general, according to an embodiment, a pattern forming method includes forming a guide pattern on a substrate. The guide pattern has a first region and a second region adjacent to the first region. A directed self-assembly material including a first polymer portion and a second polymer portion is applied to the substrate. The first region is irradiated with an energy beam. After irradiation with the energy beam, the substrate is subjected to a first heating process that causes the directed self-assembly material in the second region to separate into a first polymer phase, containing predominately the first polymer portion, and a second polymer phase, containing predominately the second polymer portion. The directed self-assembly material is removed from the first region after irradiation.

First Embodiment

Hereinafter, description will be given of the pattern forming method according to the first embodiment with reference to FIGS. 1 to 4B. In the following description of the drawings, elements which are the same as, or similar to, each other are represented using the same or similar symbols. However, in the drawings, the relationship between thicknesses and planar dimensions, the ratios of thicknesses of each layer, and the like may differ from reality, and depictions are schematic.

FIG. 1 is a flowchart illustrating a pattern forming method according to a first embodiment. The pattern forming method according to the first embodiment is as follows: guide pattern formation (S10), application of directed self-assembly material (S11), irradiation (e.g., with electron beam) (S12), annealing (first heating process) (S13), and developing and etching (S14). In this pattern forming method, a directed self-assembly material forms a fine pattern on a underlying layer to be subsequently processed, for example, the fine pattern may transferred to the underlying layer by etching the underlying layer using the fine pattern as an etch mask. For example, the directed self-assembly material is a block copolymer such as a diblock copolymer or a triblock copolymer; however, the directed self-assembly material is not limited thereto. In the first embodiment, a pattern forming method that uses a diblock copolymer will be described.

The diblock copolymer is a copolymer of two different polymeric repeat unit molecules in the same molecular polymeric chain arranged in distinct segments or blocks. Here, the different types of repeat units of the copolymer have different properties, for example, one is hydrophobic and the other is hydrophilic. Examples of the diblock copolymer include a polystyrene-polymethylmethacrylate copolymer (PS-PMMA) and a polytrimethylsilylstyrene-polyhydroxystyrene copolymer (PTMSS-PHOST. The composition of the diblock copolymer is not limited to these examples. Here, the hydrophilic polymer is referred to as a first polymer and the hydrophobic portion is referred to as a second polymer. In a diblock copolymer of PS-PMMA, PMMA would be the first polymer and PS would be the second polymer, and in a diblock copolymer of PTMSS-PHOST, PHOST is the first polymer and PTMSS is the second polymer.

Next, detailed description of aspects of the pattern forming method illustrated in FIG. 1 will be made with reference to FIGS. 2A to 4B.

FIG. 2A is a cross-sectional diagram of the layer to be processed to explain the step of the guide pattern formation (S10), which is the first step in the pattern forming method.

As illustrated in FIG. 2A, a substrate, which is a base layer 1, is prepared, a layer 2 to be processed is formed on the substrate, and a line-shaped guide 3 is formed on the layer 2 using a resist. For example, the base layer 1 is a semiconductor substrate, a glass substrate, a quartz substrate, or the like. The layer 2 is a silicon oxide film, for example, formed on the base layer 1.

In the first embodiment, the guide 3 is formed by spin coating a resist material on the layer 2 and then removing a portion of the resist material through an ArF (argon fluorine) photolithographic process, in which the resist material is selectively exposed, the substrate with the exposed resist is then heated, and then the latent pattern in the formed in the resist material is then developed in a development process. Specifically, here the guide 3 is a line and space pattern, and the space portions of the line and space pattern are removed by the development process. The layer 2 is exposed in the space portions. By forming the guide 3 of the line and space pattern, a polymer of a directed self-assembly material 4 can be disposed in the guide 3 pattern to direct the assembly of the directed self-assembly material 4. Note that, the dimensions of the line portions of the guide 3 and the space portions between the line portions of the guide 3 may be set arbitrarily to dimensions relevant to the phase separation of the directed self-assembly material 4. For example, the dimensions of the space portions are a width of 100 nm and a depth of 10 nm.

Next, as illustrated in FIG. 2B, the directed self-assembly material 4 is applied to the layer 2 on which the guide 3 has been formed (S11). The directed self-assembly material 4 in the first embodiment is a diblock copolymer of polystyrene-polymethylmethacrylate (PS-PMMA), for example, and the molecular weight (Mn) thereof is in the range of 5,000 to 50,000, for example. A layer of the directed self-assembly material 4 is formed by dissolving the directed self-assembly material 4 in a toluene solution, then applying the dissolved directed self-assembly material 4 to the layer 2, and then baking the applied directed self-assembly material on a hot plate.

Next, as illustrated in FIG. 3A, a region (target region) in the directed self-assembly material 4 is irradiated with an electron beam EB or the like (S12). Here, the region A is an irradiation (irradiated) region (target region), and the region B is a non-irradiation (non-irradiated) region. As illustrated in FIG. 3A, the irradiation region A is preferably the entire region between adjacent portions of the guide 3; however, the irradiation region A is not specifically limited to such a region. For example, the irradiation region A is irradiated with an electron beam under conditions of an acceleration voltage of 1 KV to 50 KV and a dose amount of 1,000 $\mu C/cm^2$. The electron beam exposure cuts (scissions) the main chains of the directed self-assembly material 4 within in the irradiation region A. Thus, the directed self-assembly material 4 in the irradiation region A is now comprised of lower molecular weight polymer chains. As such, the directed self-assembly material 4 within in irradiation region A may be referred to as a low molecular weight state material (directed self-assembly material 4c). For example, while a molecular weight of the directed self-assembly material 4 at the time of application is in the range of 5,000 to 50,000, a molecular weight of the directed self-assembly material 4c is in the range of 500 to 1,000 due to the irradiation process with electron beam or the like. Here, an electron beam exposure has a higher energy than the ArF (193 nm) exposure used in patterning the guide layer 3, but the exposure source used to generate directed self-assembly material 4c is not necessarily limited to electron beams. The exposure energy used to form directed self-assembly material 4c may be any beam sufficient to cause chain scission in the directed self-assembly material 4. For example, any one of an electron beam, EUV light, VUV light, UV light, an ion beam, an X-ray radiation, and visible light may be used depending on the selected structure of the directed self-assembly material 4.

Figure 3B:
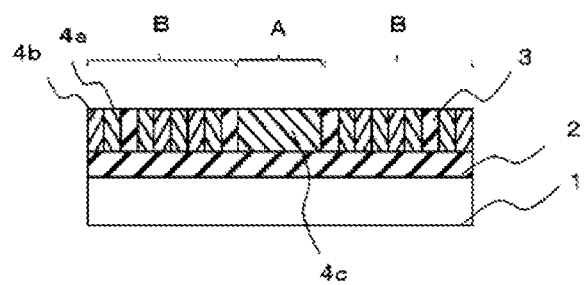

Next, as illustrated in FIG. 3B, the directed self-assembly material 4c in the irradiation region A and the directed self-assembly material 4 in the non-irradiation region B are annealed (S13). The annealing conditions can be selected, as appropriate, according to the types of the layer 2 to be processed and the directed self-assembly material 4. In the first embodiment, if the directed self-assembly material 4 is PS-PMMA, the annealing is carried out at 140° C. to 160° C. for 2 to 3 minutes. If the directed self-assembly material 4 is polytrimethylsilylstyrene-polyhydroxystyrene (PTMSS-PHOST), the annealing is carried out at 210° C. to 230° C. for 2 to 3 minutes.

The annealing allows separation of the directed self-assembly material 4 in non-irradiation region B into a first polymer phase 4a containing the hydrophilic first polymer and a second polymer phase 4b containing the hydrophobic second polymer. The predominate components of the first polymer phase 4a and the second polymer phase 4b are the first polymer and the second polymer, respectively; however, the first and second polymer phases 4a and 4b may contain other components. The composition ratio, first polymer:second polymer, of PS-PMMA which is the block copolymer used in the first embodiment is approximately 1:1. With this composition ratio, when the directed self-assembly takes place, the first polymer phase 4a and the second polymer phase 4b are arranged alternately in lamellae form (plate shapes) approximately at a width ratio of 1:1. In other words, in the first embodiment, a portion of PS and a portion of PMMA are arranged alternately with a 1:1 width ratio along the side surfaces of the guide 3 which has been formed on the base layer 1 in advance in the guide pattern formation process (S10). The shape and the pitch width of the phase separation pattern of the first polymer phase 4a and the second polymer phase 4b vary depending on the molecular weights and the composition ratio of the first polymer and the second polymer. For example, a lamellae structure is formed when the composition ratio of the second polymer to the first polymer is substantially the same (1:1), and the shapes of the structure tend to become spherical shapes as the composition of the second polymer relatively increases. As the molecular weight of the first polymer or the second polymer increases, the pitch width of the phase separation pattern of the first polymer phase 4a and the second polymer phase 4b increases.

Note that, in the present process, since the directed self-assembly material 4c in the irradiation region A is in a low molecular weight state, the directed self-assembly material 4c does not phase separate in the same manner as the higher molecular weight directed self-assembly material 4 in non-irradiation region B. Thus, the lamellae arrangement of the first polymer phase 4a and the second polymer phase 4b observed in the non-irradiation regions B is not observed in the irradiation region A. In the region A, low molecular weight molecules derived from the first polymer and the second polymer are dispersed and mixed due to post-electron beam irradiation annealing and observable distinct phases of first and second polymer may not form.

Figure 4A:
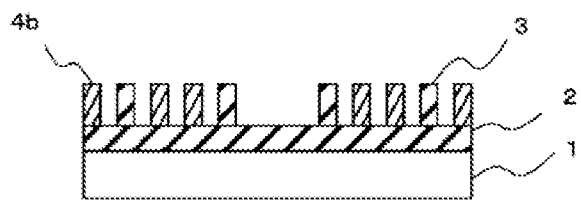
FIGS. 4A and 4B are cross-sectional diagrams illustrating a third process in the pattern forming method according to the first embodiment.

Next, as illustrated in FIG. 4A, a developer solution including isopropyl alcohol, for example, is used to selectively remove (dissolve) the directed self-assembly material 4c of region A and the first polymer phase 4a of region B (S14). Specifically, in the first embodiment, the directed self-assembly material 4c in the irradiation region A and the first polymer phase 4a in the non-irradiation region B, which contains PMMA, are removed, and only the second polymer phase 4b containing PS and the guide 3 remain. Note that, the second polymer phase 4b, instead of the first polymer phase 4a, may be removed by selecting the developer.

Figure 4B:
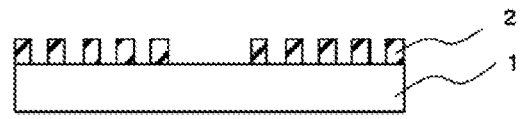

Finally, as illustrated in FIG. 4B, the layer 2 is etched using the remaining second polymer phase 4b and the guide 3 as a mask. In the first embodiment, reactive ion etching (RIE) is performed. According to the method described above, an arbitrary pattern can be formed in the layer 2.

In this manner, substantially arbitrary pattern formation using the directed self-assembly material 4 is performed.

Figure 9:
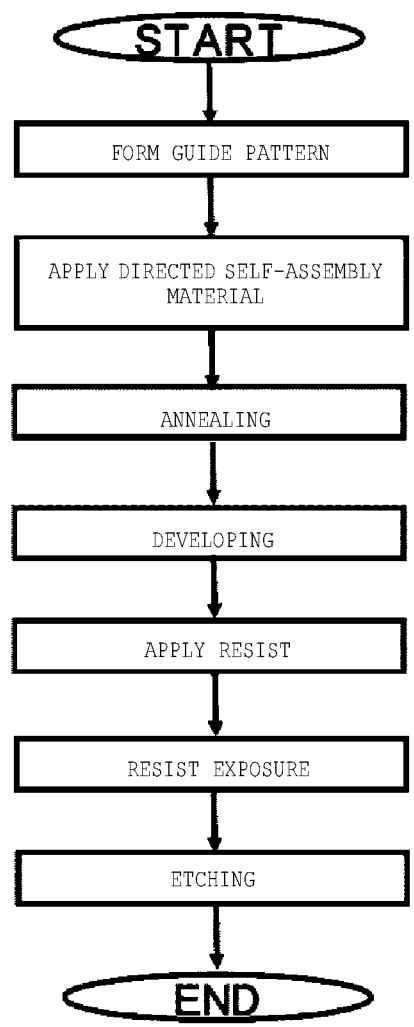
FIG. 9 is a flowchart illustrating aspects of a pattern forming method of a comparative example.

In the pattern forming method according to the first embodiment, since the region from which the directed self-assembly material 4 is to be removed is directly irradiated with the electron beam, removal of this region using a photolithography technique is not necessary after the step of developing. Hereinafter, a comparative example using a photolithography technique in conjunction with a directed self-assembly process will be described. FIG. 9 is a flowchart illustrating a pattern forming method according to the comparative example. In the pattern forming method of FIG. 9, photolithographic processes such as resist application and exposure are performed after the directed self-assembly material has been phase separated and developed. However, according to the first embodiment, the steps for the photolithography after phase separation of the directed self-assembly material can be omitted, and as a result use of an exposing device, which may take costs, can be suppressed.

In the first embodiment, it is preferable that the entire region between two adjacent portions of the guide 3 is irradiated with the electron beam; however, the region irradiated with the electron beam is not limited thereto.

Second Embodiment

Next, a pattern forming method according to a second embodiment will be described with reference to FIGS. 5 to 8.

In the second embodiment, fine pattern formation is possible using annealing (phase-separation of the directed self-assembly material) before electron beam irradiation. Therefore, in the following description of the forming method, description will be given of portions that differ from those in the first embodiment, and portions that are the same will be omitted.

FIG. 5 is a flowchart illustrating the pattern forming method according to the second embodiment. The pattern forming method according to the second embodiment includes: guide pattern formation (S20), directed self-assembly material application (S21), pre-irradiation annealing (the first heating process) (S22), irradiation (e.g., with electron beam) (S23), post-irradiation annealing (a second heating process) (S24), and developing and etching (S25).

Next, detailed description of each step of the pattern forming method illustrated in FIG. 5 will be made with reference to FIGS. 6A to 8.

First, the guide pattern formation (S20) and the directed self-assembly material application (S21) are performed as the first and second processes of the pattern forming method according to the second embodiment. Since the forming the guide 3 and applying the directed self-assembly material 4 in the second embodiment are the same as those in the first embodiment, description thereof will be omitted.

Figure 6A:
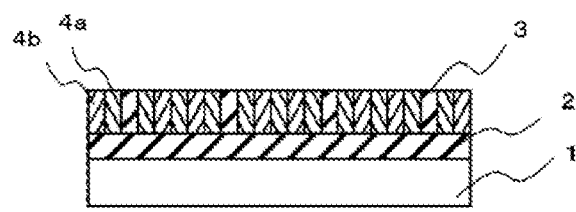
FIGS. 6A and 6B are cross-sectional diagrams illustrating a first process in the pattern forming method according to the second embodiment

Next, as illustrated in FIG. 6A, the directed self-assembly material 4 is subjected to the pre-irradiation annealing (S22). The pre-irradiation annealing separates the directed self-assembly material 4 into the first polymer phase 4a and the second polymer phase 4b. In the second embodiment, the first polymer phase 4a and the second polymer phase 4b are arranged between the guides 3 at a 1:1 width ratio in the same manner as in the first embodiment. At this time, the conditions of the pre-irradiation annealing are, for example, if the directed self-assembly material 4 is PS-PMMA, heating for 2 to 3 minutes at 140° C. to 160° C.

Figure 6B:
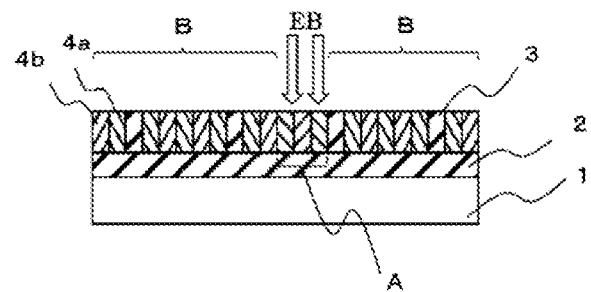

Next, as illustrated in FIG. 6B, of regions of the separated first polymer phase 4a and second polymer phase 4b, the irradiation region A to be removed is subjected to irradiation with electron beam or the like. For example, the irradiation region A is irradiated with the electron beam under conditions of an acceleration voltage of 1 KV to 50 KV and a dose amount of 1,000 μC/cm². Although the irradiation method is the same as that used in the first embodiment, in the second embodiment, instead of irradiating the entire region between adjacent portions of the guide 3, here the electron beam is irradiated on a partial region between the adjacent portions of the guide 3 along a boundary between the first polymer phase 4a and the second polymer phase 4b. In other words, in the second embodiment, a narrower region is irradiated in comparison to the first embodiment.

In the second embodiment, the electron beam irradiation cuts the main chains of the first polymer and the second polymer which form the first polymer phase 4a and the second polymer phase 4b of the irradiation region A, respectively. However, in the second embodiment, since the pre-electron beam irradiation annealing phase-separates the directed self-assembly material in advance, even if the main chains of the first polymer and the second polymer contained in the first polymer phase 4a and the second polymer phase 4b in the irradiation region A are cut, the first polymer phase 4a and the second polymer phase 4b remain in the phase-separated state, and low molecular weight molecules that are formed by the cutting of the main chains remain in each of the polymer phases 4a and 4b. Note that the molecular weight (Mn) of PS-PMMA which is used in the second embodiment is in the range of 5,000 to 50,000, and a low molecular weight molecule is a molecule with a molecular weight (Mn) in the range of 500 to 1,000.

At the boundary between the non-irradiation region B and the irradiation region A, since the first polymer or the second polymer is irradiated with the electron beam to an extent insufficient to cut the main chains, arrangement of the first polymer or the second polymer becomes irregular (not depicted in the drawings) at this boundary.

Figure 7A:
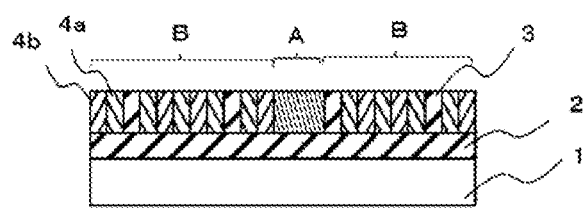
FIGS. 7A and 7B are cross-sectional diagrams illustrating a second process in the pattern forming method according to the second embodiment.

Next, as illustrated in FIG. 7A, the post-irradiation annealing is performed (S24). The post-irradiation annealing is performed at a lower temperature for a shorter period of time in comparison to the pre-irradiation annealing. For example, if the directed self-assembly material is PS-PMMA, the heating is carried out at 90° C. to 120° C. for 0.5 to 1 minutes. However, the conditions of the post-irradiation annealing are not limited thereto. The molecules in irradiation region A, which have a low molecular weight after irradiation (S23), are dispersed within in the irradiation region A by the post-irradiation annealing, and the lamellae arrangement of the first polymer phase 4a and the second polymer phase 4b can be destroyed in irradiation region A. At this time, the low molecular weight molecules derived from the first polymer and the second polymer are in a mixed state in irradiation region A. The reason that the annealing conditions differ between the pre-electron beam irradiation annealing and the post-electron beam irradiation annealing as described above is because, although higher energy is required for arranging the polymers in the pre-irradiation annealing, lower energy is sufficient to disperse the lower molecular weight segments in the post-irradiation annealing process. The post-irradiation annealing can rearrange the first polymer phase 4a or the second polymer phase 4b located at the edge of the non-irradiation region B which is positioned at the boundary between the non-irradiation region B and the irradiation region A. In other words, through the post-irradiation annealing (S24) process, the separation of the polymer phases at the edge of the non-irradiation region B is restored, and regular arrangement of the first polymer phase 4a and the second polymer phase 4b is obtained again.

Figure 7B:
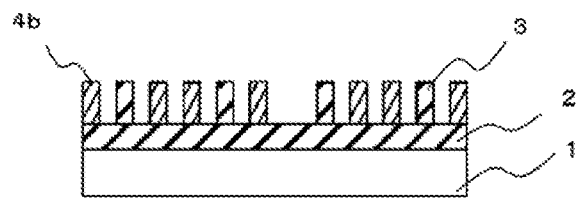

Next, developing is performed as illustrated in FIG. 7B (S25). This process can selectively remove the low molecular weight molecules in the irradiation region A and the first polymer phase 4a. Specifically, in the second embodiment, the low molecular weight molecules in the irradiation region A and the first polymer phase 4a containing PMMA are removed, and only the second polymer phase 4b containing PS and the guide 3 remain. Note that, the process of developing and etching in the second embodiment is the same as those in the first embodiment.

Figure 8:
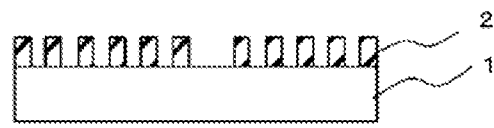
FIG. 8 is a cross-sectional diagram illustrating a third process in the pattern forming method according to the second embodiment.

Finally, as illustrated in FIG. 8, in the same manner as in the first embodiment, the layer 2 is etched using the remaining second polymer phase 4b and the guide 3 as a mask. According to the method of the second embodiment described above, a substantially arbitrary pattern can be formed in the layer 2.

Compared to the pattern forming method shown in FIG. 9 which uses the photolithography technique, the pattern forming method according to the second embodiment can omit the remove the resist application and exposure processes and can reduce the number of processes as a result.

Figure 10A:
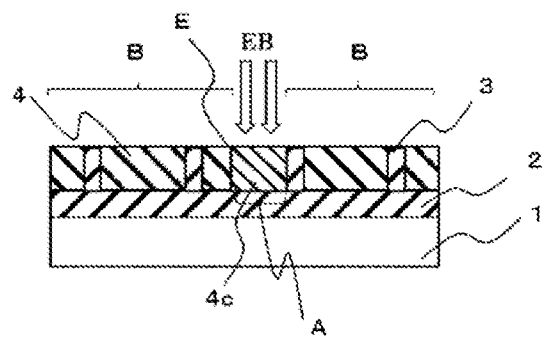
FIGS. 10A and 10B are cross-sectional diagrams illustrating a pattern forming method according to a reference example.
Figure 10B:
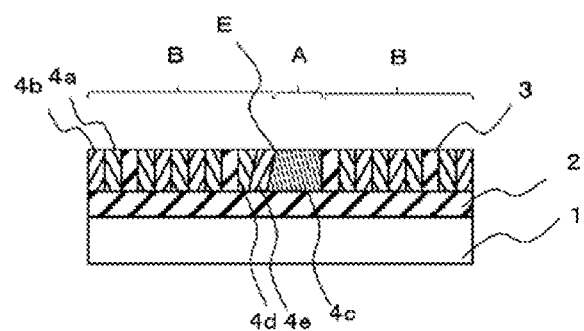

Here, a pattern forming method according to a comparative example will be considered. FIGS. 10A and 10B are cross-sectional diagrams the layer 2 to be processed to illustrate the pattern forming method according to the comparative example, in which the pre-irradiation annealing is not performed. As illustrated in FIG. 10A, a portion of the region between adjacent portions of the guide 3 is irradiated with an electron beam or the like. At this time, the region irradiated is the irradiation region A. The directed self-assembly material 4 of the irradiation region A becomes the low molecular weight state (directed self-assembly material 4c). As illustrated in FIG. 10A, one edge of the irradiation region A is in contact with a portion of the guide 3, and the other edge is in contact with the directed self-assembly material 4 that has not been irradiated with electron beam or the like.

Next, as illustrated in FIG. 10B, the directed self-assembly material 4 that has not been irradiated is phase-separated. An end portion E of the directed self-assembly material 4 in the non-irradiation region B is in contact with the directed self-assembly material 4c instead of the guide 3. Although it is preferable that edges of the directed self-assembly material 4 in the non-irradiation region B are in contact with the guide 3 to obtain the regular arrangement of the first polymer phase 4a and the second polymer phase 4b by phase separation, only one edge of the directed self-assembly material according to this comparative example is in contact with the guide 3. The portion of the directed self-assembly material in the non-irradiation region B that is in contact with the directed self-assembly material 4c becomes directed self-assembly materials 4d and 4e in which the polymer arrangement is irregular.

In contrast to the comparative example described above, since the pre-irradiation annealing is performed in the second embodiment, the first polymer phase 4a or the second polymer phase 4b acts in the same manner as the guide 3 even if the non-irradiation region B is present between the guides 3, and since the post-irradiation annealing causes a second phase separation, the irregularity of the arrangement of the directed self-assembly materials 4d and 4e in the non-irradiation region B is restored. By performing the irradiation after the phase separation, the first polymer phase 4a or the second polymer phase 4b of a portion positioned between the adjacent portions of the guides 3 can be selectively removed. Therefore, fine pattern formation is possible.

The pattern forming methods according to the first and second embodiments can be applied to patterning of a semiconductor substrate, a quartz glass substrate, or the like. Therefore, these pattern forming methods can be used for manufacture of a semiconductor substrate, a photomask, a nanoimprint template, a display, a solar panel, or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming method, comprising:
   forming a guide pattern on a substrate including a first region and a second region adjacent to the first region by applying a photoresist on the substrate, selectively exposing the photoresist to light, and developing the exposed photoresist;
   applying a directed self-assembly material including a first polymer portion and a second polymer portion to the substrate;
   irradiating the first region with an energy beam;
   after the irradiation with the energy beam, subjecting the substrate to a first heating process and causing the directed self-assembly material in the second region to separate into a first polymer phase containing predominately the first polymer portion and a second polymer phase containing predominately the second polymer portion; and
   removing, simultaneously, the first polymer portion and the second polymer portion of the directed self-assembly material from the first region after irradiation.

2. The pattern forming method according to claim 1, wherein the energy beam is an electron beam, and at least one of the first and second polymer portions comprises chains scissionable by electron beam irradiation.

3. The pattern forming method according to claim 1, wherein the guide pattern comprises a line and space pattern.

4. The pattern forming method according to claim 1, wherein the first region contacts adjacent portions of the guide pattern.

5. The pattern forming method according to claim 1, wherein irradiating the first region with the energy beam reduces a molecular weight of the directed self-assembly material.

6. The pattern forming method according to claim 1, wherein the energy beam is one selected from an energy type of electron beam, EUV light, VUV light, UV light, ion beam, X-ray, and visible light.

7. The pattern forming method according to claim 1, further comprising:

removing the first polymer phase from the second region and leaving the second polymer phase in the second region; and transferring a pattern to the substrate using the guide pattern and the second polymer phase as a mask.

8. The pattern forming method according to claim 1, wherein the directed self-assembly material in the first region does not phase separate in the first heating process.

9. A pattern forming method, comprising:
forming a guide pattern on a substrate by applying a photoresist on the substrate, selectively exposing the photoresist to light, and developing the exposed photoresist, the guide pattern including a first region and a second region adjacent to the first region;
applying a directed self-assembly material, including a first polymer portion and a second polymer portion, to the substrate as a single layer;
subjecting the substrate to a first heating process and causing the directed self-assembly material to separate into a first polymer phase containing predominately the first polymer portion and a second polymer phase containing predominately the second polymer portion;
irradiating the first region with an energy beam after the first heating process and leaving the second region unexposed by the energy beam;
subjecting the substrate to a second heating process after the irradiation with the energy beam; and
removing the irradiated directed self-assembly material from the first region after the second heating process with a developer.

10. The pattern forming method according to claim 9, wherein the second heating process is at a lower temperature than the first heating process.

11. The pattern forming method according to claim 9, wherein a time period of the second heating process is shorter than a time period of the first heating process.

12. The pattern forming method according to claim 9, wherein the directed self-assembly material comprises one of a polystyrene-polymethylmethacrylate copolymer and a polytrimethylsilylstyrene-polyhydroxystyrene copolymer.

13. The pattern forming method according to claim 9, wherein the energy beam is one selected from an energy type of electron beam, EUV light, VUV light, UV light, ion beam, X-ray, and visible light.

14. The pattern forming method according to claim 9, wherein the energy beam is an electron beam, and at least one of the first and second polymer portions comprises chains scissionable by electron beam irradiation.

15. The pattern forming method according to claim 9, further comprising:

removing the first polymer phase from the second region and leaving the second polymer phase in the second region; and transferring a pattern to the substrate using the guide pattern and the second polymer phase as a mask.

16. A pattern forming method, comprising:
forming a guide pattern on a substrate in a photolithographic process, the guide pattern formed in the photolithographic process including a first region and a second region;
spin coating a directed self-assembly material onto the substrate to fill openings in the guide pattern with the directed self-assembly material, the openings corresponding to the first and second regions of the guide pattern;
irradiating the directed self-assembly material in the first region with an energy beam and causing the irradiated directed self-assembly material to become soluble in a developer;
heating the substrate in a first heating process to cause the directed self-assembly material to separate into a first phase portion and a second phase portion, the first and second phase portions forming at least a partially regular pattern in at least one of the first and second regions of the guide pattern;
dissolving all of the irradiated directed self-assembly material in the developer;
removing the first phase portion of the directed self-assembly material from the second region and leaving the second phase portion of the directed self-assembly material in the second region; and
transferring a pattern to the substrate using the guide pattern and the second phase portion as a mask.

17. The pattern forming method according to claim 16, wherein the first heating process occurs before irradiation of the directed self-assembly material in the first region with the energy beam.

18. The pattern forming method according to claim 17, further comprising:
heating the substrate in a second heating process that is after the irradiation and before the removing of the first phase portion.

19. The pattern forming method according to claim 16, wherein the first heating process occurs after irradiation of the directed self-assembly material in the first region with the energy beam.

20. The pattern forming method according to claim 16, wherein the directed-self-assembly material in the first region of the guide pattern does not separate into the first phase portion and the second phase portion in the first heating process.

* * * * *